United States Patent [19]

Meyer

[11] 4,316,152
[45] Feb. 16, 1982

[54] DATA TRACKING PHASE LOCKED LOOP

[75] Inventor: Gerald L. Meyer, Loveland, Colo.

[73] Assignee: Hewlett-Packard Company, Palo Alto, Calif.

[21] Appl. No.: 77,980

[22] Filed: Sep. 24, 1979

[51] Int. Cl.[3] .............................................. H03L 7/08
[52] U.S. Cl. ..................................... 331/1 A; 331/18
[58] Field of Search ..................... 331/1 A, 8, 17, 18; 360/42, 51; 307/269; 375/120

[56] References Cited

U.S. PATENT DOCUMENTS 3,271,688 9/1966 Gschwind et al. ............. 331/1 A X
4,138,650 2/1979 Anderson ........................... 331/1 A
4,151,485 4/1979 LaFratta ............................ 331/1 A Primary Examiner—Siegfried H. Grimm
Assistant Examiner—Edward P. Westin
Attorney, Agent, or Firm—Edward L. Miller

[57] ABSTRACT

A counter of modulus n counts the oscillations of a variable frequency oscillator whose center frequency is n-times the nominal frequency of digital data having phase variations. The occurrence of a selected value of the count may be taken as a phase corrected clock for the digital data. Differences between successive values in the counter as pulses of the digital data occur indicate shifts in phase thereof, while the modularity prevents absent data pulses from contributing to the phase error. Successive counts are captured, made available as phase error information in digital form, and used to drive a digital-to-analog converter whose output controls the variable frequency oscillator.

8 Claims, 2 Drawing Figures

DATA TRACKING PHASE LOCKED LOOP

BACKGROUND AND SUMMARY OF THE INVENTION

In systems of the type that transfer data it is often necessary or desirable to generate from noise corrupted data a clock signal synchronized with that data. This is often done in telecommunication systems and in magnetic data storage systems. Circuits which provide such a synchronized clock are commonly called data tracking phase locked loops.

A data tracking phase locked loop is a feedback control system which minimizes the phase error between transitions in noisy data and the transitions of a variable frequency local oscillator. The minimization is achieved by varying the frequency of the local oscillator in accordance with a measured phase error. The phase error detection portion of the loop should meet the following criteria:

1. The phase detector output should have a low content of harmonics of the clock frequency. Otherwise, excessive filtering may be required that can unduly dampen the response of the loop to rapid phase error excursions.
2. The phase detector should tolerate normally absent data pulses (i.e., logical zeros) without generating a false phase error.

In addition, it would be useful in the testing and repair of equipment employing data tracking phase locked loops if the phase error information were made available to the system itself, particularly if computer or microprocessor controlled equipment are involved. Such phase error information could serve as a figure of merit for the operation of the data transfer channel, and allow the system to monitor or even log that aspect of its own performance. This would be very useful as a diagnostic aid both in the factory and in the field.

In a digital system it would be advantageous if the phase error information were also digital. The advantage would be greater still if the manner of obtaining the phase error were inherently digital in nature so that an expensive high speed analog-to-digital conversion can be avoided. Furthermore, digital phase error information can be arithmetically manipulated by "digital filters" within the phase locked loop, giving the designer added flexibility in choosing the response characteristics of the loop.

Furthermore, it would be advantageous if the data tracking phase locked loop itself were capable of readily attaining the phase locked condition without sweeping the frequency of the local oscillator or requiring a special preamble in the data, as in some prior data tracking phase locked loops.

Accordingly, it is an object of the present invention to provide a data tracking phase locked loop that incorporates a phase detector that produces a low content of harmonics of the clock frequency.

Another object of the invention is to provide a data tracking phase locked loop that tolerates normal absence of data pulses without generating a false phase error.

Another object of the invention is to provide a data tracking phase locked loop wherein the phase error detector inherently produces a digital output.

Another object of the invention is to provide a data tracking phase locked loop that incorporates a digital filter within its feedback loop.

It is a further object of the invention to provide a data tracking phase locked loop that readily attains the phase locked condition without sweeping the local oscillator or requiring a special preamble in the data.

These objects of the invention are met by data tracking phase locked loops constructed in accordance with the following summary.

A variable frequency oscillator runs with a center frequency that is an integral multiple n times greater than the nominal frequency of the data. A counter of modulus n continuously counts the oscillations of the variable frequency oscillator, dividing the period of the phase varying data into approxiimately n parts. The value of the count is captured each time a data pulse occurs. Once the loop is in lock, if the data were to remain absolutely stable each captured value would be the same as its predecessor. As phase shifting of the data occurs the value of the captured count increases or decreases in kind. Captured counts may be first digitally filtered or used directly to drive a digital-to-analog converter, whose output is analog filtered before being used to control the variable frequency oscillator. For example, a decrease in the captured count means the data arrived sooner and causer a voltage change in the digital-to-analog converter that causes the variable frequency oscillator to operate at a higher frequency, thus tracking the shift in the phase of the data.

A phase corrected clock is easily obtained once the variable frequency oscillator tracks the phase variations in the data; one way is to produce a signal in relation to the occurrence of a particular bit or particular count in the counter.

The loop is readily placed in phase lock by briefly operating it in a rapid phase error acquisition mode wherein the counter is set to n/2 each time a data pulse is received. During this mode of operation the loop becomes a frequency loop that approximates the behavior of a phase locked loop.

Since the output of the digital-to-analog converter is stable except when there is a change in the value of a captured count, and since the digital-to-analog converter quickly stabilizes following such changes, the detected phase error represented by the output of the digital-to-analog converter is low in harmonics of the clock frequency.

Since the counter has a modulus of n it simply "rolls over" and begins counting anew if a data pulse is absent; the previous captured count remains unaltered and no false phase error is generated.

Since the phase error originates as a count captured from a counter, the digital phase error information is inherently digital.

Since digital phase error information is readily available it may be digitally filtered before being used to control the variable frequency oscillator via the digital-to-analog converter.

Since the behavior of this circuit as a frequency loop approximates that of a phase locked loop, briefly operating the data tracking loop in a frequency loop mode before entering the phase locked mode readily allows the loop to attain the phase locked condition without sweeping the local oscillator or employing a preamble in the data.

DESCRIPTION OF THE PREFERRED EMBODIMENT

Figure 1:
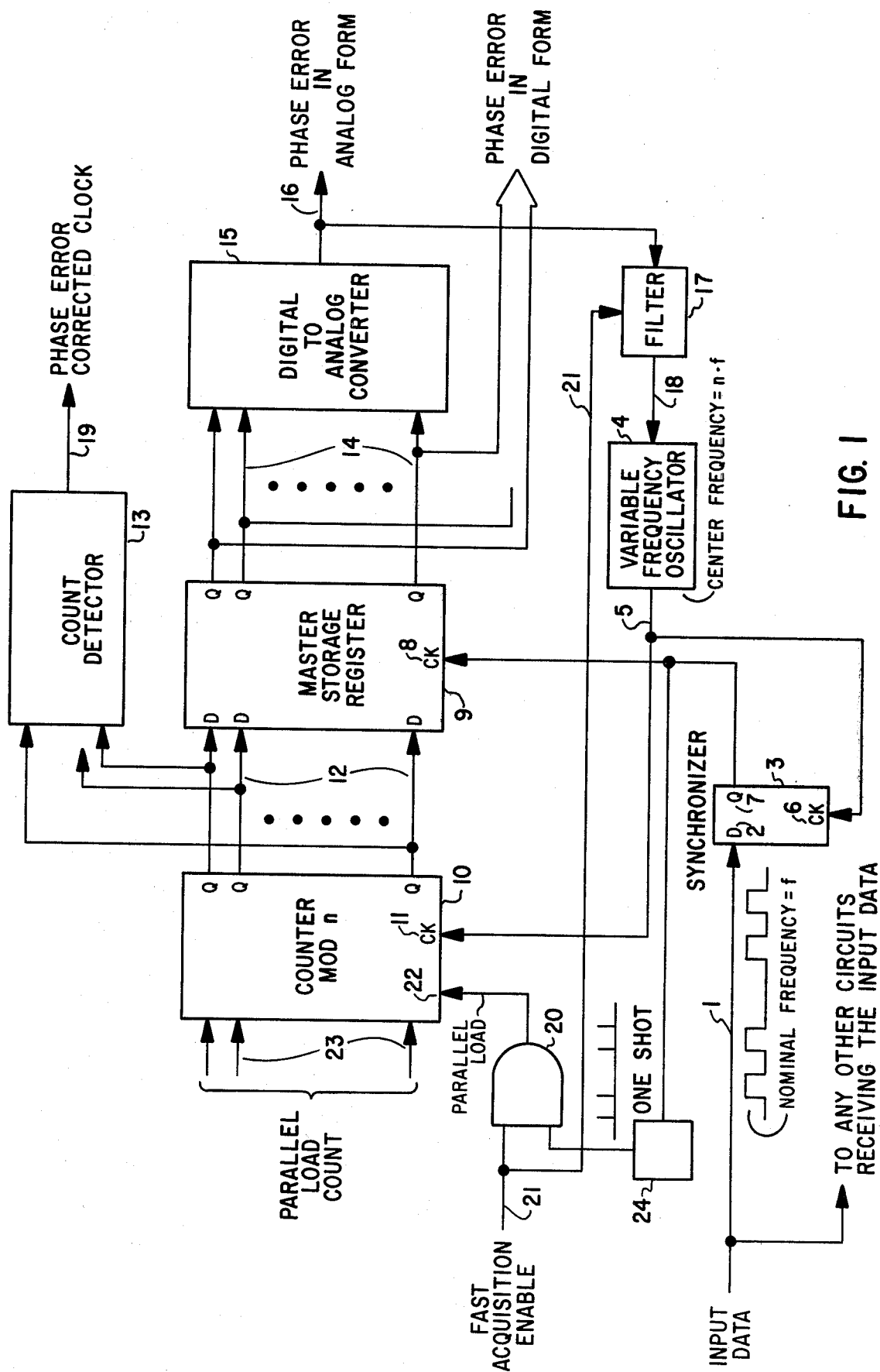
FIG. 1 is a block diagram of a data tracking phase locked loop constructed according to a preferred embodiment of the invention, but without incorporating a digital filter.

Shown in FIG. 1 is a block diagram of a data tracking phase locked loop constructed in accordance with a preferred embodiment of the invention. The output 5 of a variable frequency oscillator 4 is fed to a clock input 6 of a D-type latch 3 and also to a clock input 11 of a counter 10. The outputs 12 of the counter are fed to a master storage register 9 and also to a unique count detector 13. Input data 1 is fed to a D input 2 of the latch 3. A Q output 7 of the latch 3 is fed to a clock input 8 of a master storage register 9, as well as to a one shot 24. The outputs 14 of the master storage register 9 represent the phase error in digital form and are made available to external circuitry as well as being supplied to a digital-to-analog converter 15. The output 16 of the digital-to-analog converter 15 represents the phase error in analog form and is supplied to external circuitry as well as to the signal input of a filter 17. The output 18 of the filter 17 is fed to a control input of the variable frequency oscillator 4.

The output 19 of the count detector 13 is a signal transitioning in response to the occurrence of some preselected arbitrary count in the counter 10 and represents a phase error corrected clock.

The output of one shot 24 is connected to one input of an AND gate 20. Another input to AND gate 20 is a signal 21, FAST ACQUISITION ENABLE, which is also supplied as a control input to the filter 17. The output of the AND gate 20 is supplied to a parallel load input 22 of the counter 10. Lines 23 represents a count to be parallel loaded into the counter 10.

The operation of the circuit of FIG. 1 is as follows. The input data 1 has a nominal frequency f. The variable frequency oscillator 4 has a center frequency that is an integral number n times greater than f. In one actual circuit where the input data is from a magnetic disc f is approximately 500 kHz and n is 256. The counter 10 counts with a modulus of n the oscillations of the variable frequency oscillator 4; that is, it counts from zero to n-1 and starts over with zero as the next count. The value of the current count in the counter 10 is captured with a master storage register 9 each time there is a pulse in the input data 1.

The latch 3 is a D-type flip-flop whose Q output 7 is set to the logical value of the D input 2 each time clock input 6 goes low. Each time the output 5 of the variable frequency oscillator 4 goes low the latch 3 captures the current logical value of the input data and presents that value on the Q output 7. The latch 3 thus acts to synchronize possible asynchronous transitions in the input data 1 with the transitions in the output 5 of the variable frequency oscillator 4. The Q output 7 represents synchronized input data that may be applied to other elements of the circuit that are clocked in synchronism with the transitions from the variable frequency oscillator 4. In particular, the master storage register 9 uses the output of the synchronizing latch 3 to capture the current value of the count in the counter 10. The counter is not reset by this, and continues to count without interruption.

For the sake of further explanation, assume that the input data is phase stable and is exactly of a frequency that equals the frequency of the variable frequency oscillator divided by n. Some pulses may be legitimately absent from the data, however. Further assume that the count in the counter was n/2 when the previous count was captured by the master storage register. Under these conditions all subsequent counts captured by the master storage register will also be n/2.

Retaining those assumptions, it is seen that the count detector 13 produces an output 19 that may be used as a clock that is in synchronism with the input data. The relative phase of the output 19 and the input data 1 is determined by selecting which value of the count is detected. A clock for the input data could also be formed by a separate divider (not shown) driven by the variable frequency oscillator.

The digital-to-analog converter produces an analog control signal 16 in relation to the count in the master storage register. When the count is n/2 the amplitude of the control signal is zero. When the count is less than or greater than n/2 the polarity of the control signal changes in kind, while its amplitude varies in proportion to the difference between the count and n/2.

The output of the digital-to-analog converter is filtered by analog filter 17 and then applied to the variable frequency oscillator. The filter 17 further defines the response characteristics of the loop. The variable frequency oscillator is adjusted to run at exactly the frequency assumed above (n times f) when the amplitude of the signal at its control input is zero.

Thus the loop as described above, with its attendant assumptions, is in equilibrium. That is, there is little or no difference between the phase of the input data during its immediately preceeding cycles and the phase of the input data during the current cycle. This results in no change to the captured count, further resulting in a nonchanging output from the digital-to-analog converter and a nonchanging frequency from the variable frequency oscillator. In the present embodiment the circuit parameters have been chosen such that when the loop is in equilibrium the captured count is exactly n/2 and the corresponding frequency of the variable frequency oscillator is exactly n-times the expected center frequency of the input data. As shown below, changes in the phase or frequency of the input data cause a loss of equilibrium resisted by the loop by minimizing changes in the captured count of the counter.

Now assume that one or more data pulses occur at a faster rate than before. This will diminish the count in the counter, producing a corresponding change in the output 16 of the digital-to-analog converter. The polarity of the change is chosen such that it will cause an increase in frequency of the variable frequency oscillator. This tends to increase the count in the counter back towards n/2. Similarly, a decrease in frequency of the variable frequency oscillator causes a decrease in the count whenever the count goes above n/2 due to slowing of the rate of the input data.

Thus, the loop is a negative feedback loop that nulls the difference between the current count in the counter 10 and the value n/2, by continuously adjusting the variable frequency oscillator to oscillate at a frequency n times the current input data rate, even though that rate may vary. The counter 10 and count detector 13 combine to divide that frequency by n and produce a phase error corrected clock that tracks frequency and phase variations in the input data.

Absent data pulses do not alter either the equilibrium or the null seeking described above. First, because an absent data pulse by its very absence prevents a new value from being captured in the master storage register, and second, because the modularity of the counter "absorbs" by its roll-over the count that would have been captured, and creates a subsequent count as if its predecessor had been captured anyway.

Phase error information in digital form is available from the output 14 of the master storage register. Phase error information in analog form is available from the output 16 of the digital-to-analog converter.

The circuit of FIG. 1 can also be operated in a rapid phase error acquisition mode by supplying to the circuit a signal 21 called FAST ACQUISITION ENABLE. The presence of this signal does two things. First, it acts upon the control input to the filter 17 to reduce the delay through the filter. Second, it enables narrow pulses from the one shot 24 to be felt at the parallel load input 22 of the counter 10. Thus, each cycle of the input data causes the counter 10 to be preset to the value of the parallel load count 23, which is chosen to equal the design value of the captured count when the loop is in equilibrium. In the present embodiment that is n/2.

The actual count in the counter 10 is still transferred to the master storage register 9 each time a cycle of the input data occurs. Thus, while in the rapid phase error acquisition mode the circuit acts as a frequency loop, producing a digital output 14 and an analog output 16 that are proportional to the difference between the frequency of the input data and the frequency of the variable frequency oscillator divided by n. The variable frequency oscillator tracks (times a factor of n) the frequency of the input data. Some phase difference may occur.

When preceeded by a brief period of operation in the rapid phase error acquisition mode the loop subsequently nulls itself more quickly in the normal phase tracking mode than if the counter were merely allowed to contain an arbitrary count, or a count of zero, when circuit operation commenced. That is, the captured count begins immediately to approximate the difference between current loop conditions and those of true equilibrium as described above. Once the loop stabilizes in the rapid phase error acquisition mode the signal FAST ACQUISITION ENABLE may be removed and normal data-phase tracking attained with minimal disturbance to the loop.

Figure 2:
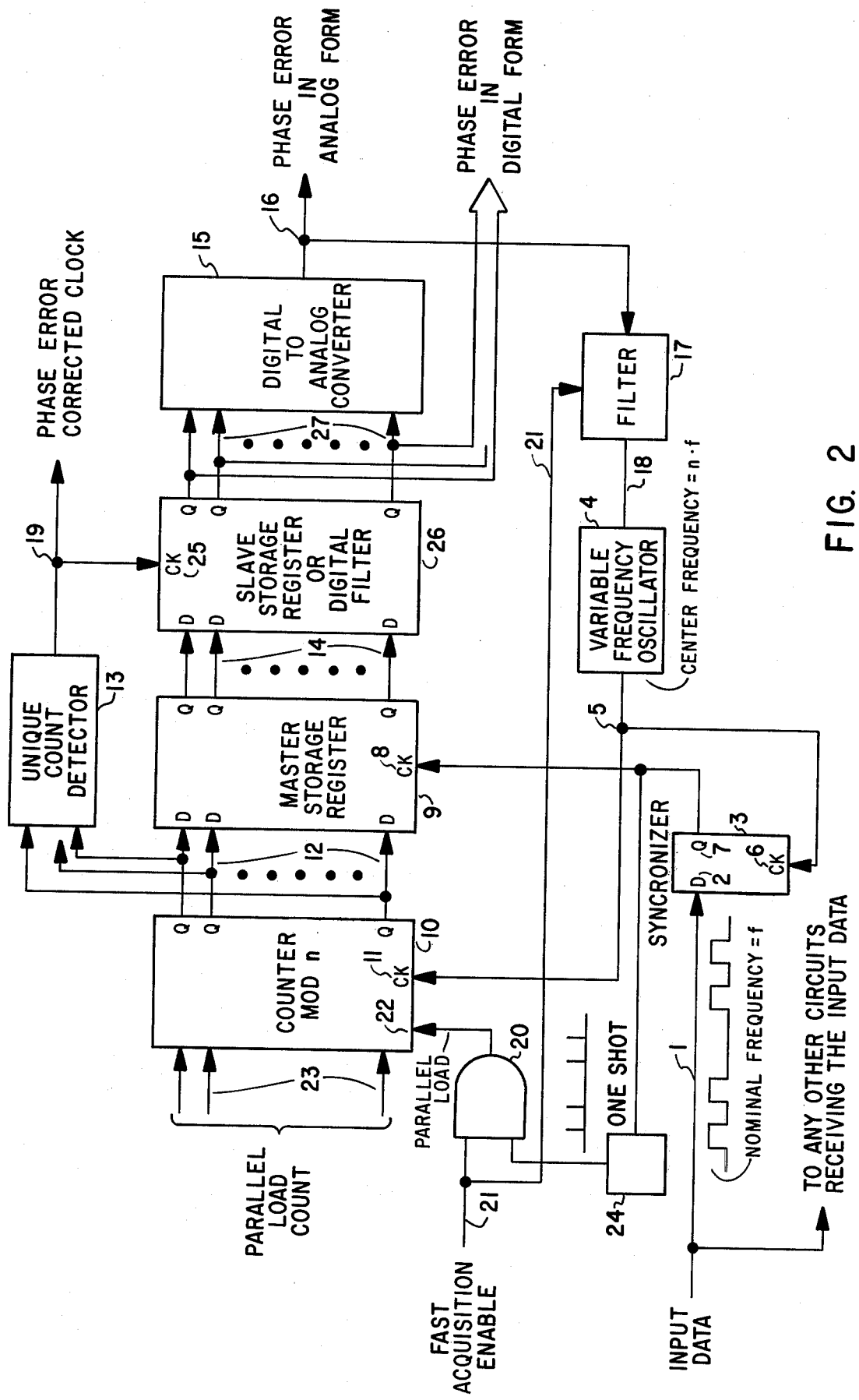
FIG. 2 is a block diagram of a data tracking phase locked loop constructed according to a preferred embodiment of the invention, and incorporating a digital filter.

An alternate embodiment of the invention is shown in FIG. 2. The circuit of FIG. 2 differs from that of FIG. 1 in that a circuit element 26, which may be either a slave storage register or a digital filter, receives the outputs 14 of the master storage register 9. The output 19 of the count detector 13 is connected to a clock input 25 of the slave storage register or digital filter 26. The outputs 27 thereof are connected to the digital-to-analog converter, and also represent the phase error in digital form.

The operation of the circuit of FIG. 2 is similar in most respects to that of the circuit of FIG. 1. The difference is that once each time during the counting cycle of the counter 10 the previously captured count is transferred into the slave storage register or digital filter. This offers the advantage that the digital-to-analog converter is isolated from sudden changes in phase in the input data that could produce two closely occurring outputs of the synchronizer 3 with widely differing counts in the counter. By allowing the input to the digital-to-analog converter to change only at regular intervals related to the count in the counter 10 a more stable output from the digital-to-analog converter is produced, and that output is then lower in harmonics.

Circuit elements 26 may also be a digital filter whose digital output 27 is arithmetically related to the preceeding sequence of captured counts stored in the master storage register 9.

What is claimed is:

1. A phase locked loop for tracking variations in phase of an input signal having a nominal frequency, the phase locked loop comprising:
   a variable frequency oscillator having a center frequency that is an integer multiple n times greater in frequency than the nominal frequency of the input signal and whose variations in frequency are in response to amplitude variations in a control signal;
   a counter coupled to the variable frequency oscillator, for counting with modulus n the oscillations of the variable frequency oscillator;
   first storage signal generation means receiving the input signal and coupled to the variable frequency oscillator, for producing one cycle of a first storage signal in response to each cycle of the input signal, a transition of each cycle of the first storage signal being synchronized with the oscillations of the variable frequency oscillator;
   first storage means coupled to the counter, for storing in response to each synchronized transition of the first storage signal the value of the count in the counter;
   second storage signal generation means coupled to the counter, for producing one cycle of a second storage signal in response to the value of count reaching a pre-selected value;
   second storage means coupled to the first storage means, for storing in response to the second storage signal the value of the count stored in the first storage means; and
   conversion means coupled to the second storage means, for producing a control signal of variable amplitude coupled to the variable frequency oscillator, the amplitude of the control signal being in relation to the value of the count stored in the second storage means.

2. A phase locked loop as in claim 1 further comprising a filter coupled between the conversion means and the variable frequency oscillator, for filtering the control signal before it is applied to the variable frequency oscillator.

3. A phase locked loop as in claim 1 further comprising means to preset the counter to a selected count in response to transitions in the input signal.

4. A phase locked loop for tracking variations in phase of an input signal having a nominal frequency, the phase locked loop comprising:
   a variable frequency oscillator having a center frequency that is an integer multiple n times greater in frequency than the nominal frequency of the input signal and whose variations in frequency are in response to amplitude variations in a control signal;
   a counter coupled to the variable frequency oscillator, for counting with modulus n the oscillations of the variable frequency oscillator;

first storage signal generation means receiving the input signal and coupled to the variable frequency oscillator, for producing one cycle of a first storage signal in response to each cycle of the input signal, a transition of each cycle of the first storage signal being synchronized with the oscillations of the variable frequency oscillator;

first storage means coupled to the counter, for storing in response to each synchronized transition of the first storage signal the value of the count in the counter;

second storage signal generation means coupled to the counter, for producing one cycle of a second storage signal in response to the value of count reaching a pre-selected value;

digital filter means coupled to the first storage means, for accepting in response to the second storage signal the value of the count stored in the first storage means, and for producing a digital output whose value is arithmetically related to a plurality of previously accepted values from the first storage means; and conversion means coupled to the digital output of the digital filter means, for producing a control signal of variable amplitude coupled to the variable frequency oscillator, the amplitude of the control signal being in relation to the value of the count stored in the second storage means.

5. A phase locked loop as in claim 4 further comprising a filter coupled between the conversion means and the variable frequency oscillator, for filtering the control signal before it is applied to the variable frequency oscillator.

6. A phase locked loop as in claim 4 further comprising means to preset the counter to a selected count in response to transitions in the input signal 7. A method of tracking phase variations in a data signal having a nominal frequency comprising the steps of:

counting by a modulus n the cycles of a variable frequency oscillation having a center frequency n times greater in frequency than the nominal frequency of the input data;

capturing the value of the count of the variable frequency oscillation each time a cycle of the input data occurs;

storing the captured value each time the count of the variable frequency oscillation attains a selected value between zero and n-1; and controlling in relation to the stored value the frequency at which the variable frequency oscillation occurs, such that increases in the captured value reduce the frequency of the variable frequency oscillation, and decreases in the captured value increase the frequency of the variable frequency oscillation.

8. A method as in claim 7, further comprising the step of generating in response to the variable frequency oscillation a signal having a period equal to the duration of n consecutive cycles of the variable frequency oscillation.

* * * * *